(12) United States Patent
Tanida

(10) Patent No.: US 9,165,962 B2
(45) Date of Patent: Oct. 20, 2015

(54) SOLID STATE IMAGING DEVICE

(71) Applicant: Kabushiki Kaisha Toshiba, Minato-ku (JP)

(72) Inventor: Kazumasa Tanida, Oita (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/093,642

(22) Filed: Dec. 2, 2013

(65) Prior Publication Data

US 2015/0035100 A1    Feb. 5, 2015

(30) Foreign Application Priority Data

Jul. 31, 2013    (JP) ................. 2013-159906

(51) Int. Cl.
*H01L 31/0232* (2014.01)
*H01L 27/146* (2006.01)

(52) U.S. Cl.
CPC ...... *H01L 27/14623* (2013.01); *H01L 27/1463* (2013.01); *H01L 27/1464* (2013.01)

(58) Field of Classification Search
CPC .................. H01L 27/14623; H01L 27/14625
USPC ................................................ 257/432, 435
See application file for complete search history.

(56) References Cited

U.S. PATENT DOCUMENTS

| | | | |
|---|---|---|---|
| 8,378,399 B2 * | 2/2013 | Maeda ........................... | 257/292 |
| 2009/0250779 A1 | 10/2009 | Hirose et al. | |
| 2010/0188532 A1 | 7/2010 | Kusaka et al. | |
| 2010/0201834 A1 * | 8/2010 | Maruyama et al. ........ | 348/222.1 |
| 2010/0327390 A1 * | 12/2010 | McCarten et al. ............ | 257/447 |
| 2010/0327391 A1 * | 12/2010 | McCarten et al. ............ | 257/447 |
| 2010/0327392 A1 * | 12/2010 | McCarten et al. ............ | 257/447 |
| 2011/0156186 A1 * | 6/2011 | Iida et al. ...................... | 257/432 |

(Continued)

FOREIGN PATENT DOCUMENTS

| JP | 2009-65095 | 3/2009 |
|---|---|---|
| JP | 2009-252973 A | 10/2009 |

(Continued)

OTHER PUBLICATIONS

Office Action issued Dec. 23, 2014 in Korean Patent Application No. 10-2013-147354 (with English language translation).

(Continued)

*Primary Examiner* — Bilkis Jahan
(74) *Attorney, Agent, or Firm* — Oblon, McClelland, Maier & Neustadt, L.L.P.

(57) ABSTRACT

A solid state imaging device includes a semiconductor layer, and a light shielding portion. The semiconductor layer has multiple photoelectric conversion elements. The light shielding portion is provided in the semiconductor layer, and has a light shielding member whose interface with the semiconductor layer is covered by an insulating film. The light shielding portion includes a light shielding region and an element isolation region. The light shielding region is provided in the semiconductor layer on the side close to the light receiving surface of the photoelectric conversion element for shielding light incident on the photoelectric conversion element from a specific direction. The element isolation region is formed to project in the depth direction of the semiconductor layer from the light shielding region toward a portion between the multiple photoelectric conversion elements in order to electrically and optically isolate the multiple photoelectric conversion elements from one another.

6 Claims, 6 Drawing Sheets

(56) References Cited

U.S. PATENT DOCUMENTS

| | | |
|---|---|---|
| 2012/0033119 A1* | 2/2012 | Shinohara .................... 348/302 |
| 2012/0202307 A1* | 8/2012 | Suzuki et al. .................. 438/57 |
| 2012/0217602 A1* | 8/2012 | Enomoto ....................... 257/432 |
| 2012/0224096 A1 | 9/2012 | Shimoda et al. |
| 2013/0021499 A1 | 1/2013 | Ui et al. |

FOREIGN PATENT DOCUMENTS

| | | |
|---|---|---|
| JP | 2010-213253 | 9/2010 |
| JP | 2012-169530 A | 9/2012 |
| JP | 2012-182332 | 9/2012 |
| KR | 10-2013-0066565 A | 6/2013 |
| TW | 201225276 A1 | 6/2012 |
| TW | 201316760 A1 | 4/2013 |

OTHER PUBLICATIONS

Office Action issued May 26, 2015 in Taiwanese Patent Application No. 102144048 (with English translation).

* cited by examiner

SOLID STATE IMAGING DEVICE

CROSS-REFERENCE TO RELATED APPLICATION

This application is based upon and claims the benefit of priority from Japanese Patent Application No. 2013-159906, filed on Jul. 31, 2013; the entire contents of which are incorporated herein by reference.

FIELD

Embodiments described herein relate generally to a solid state imaging device, and a method of manufacturing a solid state imaging device.

BACKGROUND

Conventionally, an electronic device such as a digital camera or a mobile terminal with camera includes a camera module having a solid state imaging device. The solid state imaging device has multiple photoelectric conversion elements arranged two-dimensionally corresponding to each pixel of a captured image.

Each of the photoelectric conversion elements is provided on a semiconductor layer. It photoelectrically converts light, which is incident through an insulating layer, a color filter, and a microlens stacked on the side of the semiconductor layer where light enters, into charges in an amount according to the amount of the received light, and stores the charges as signal charges indicating brightness of each pixel. A light shielding portion for shielding light incident from a specific direction on each photoelectric conversion element is provided in the insulating layer formed between the photoelectric conversion element and the color filter.

For example, the photoelectric conversion element for detecting a phase difference formed for detecting a focus of an imaging optical system has a light shielding portion provided on its light receiving surface for covering a part of the light receiving surface in order to pupil-divide the incident light. A light shielding portion that shields light incident from the color filter corresponding to the adjacent photoelectric conversion element is provided between the photoelectric conversion elements used for the image capture, viewed from the side where light enters.

In the solid state imaging device described above, the incident light might irregularly reflect on the side face of the light shielding portion to deteriorate light-receiving sensitivity. If the light shielding portion is made thin, the irregular reflection can be reduced. However, a part of a fine pattern on the light shielding portion might be lost due to electric or mechanical stress. On the other hand, when the light shielding portion is made thick, flatness is difficult to secure, so that an air bubble called a void is generated in the insulating layer during a step of burying the light shielding portion with the insulating layer. Such void causes deterioration in the light-receiving sensitivity.

DETAILED DESCRIPTION

In general, according to one embodiment, a solid state imaging device includes a semiconductor layer, and a light shielding portion. The semiconductor layer has multiple photoelectric conversion elements that are arranged in a two-dimensional array. The light shielding portion is provided in the semiconductor layer, and has a light shielding member whose interface with the semiconductor layer is covered by an insulating film. The light shielding portion includes a light shielding region and an element isolation region. The light shielding region is provided in the semiconductor layer on the side close to the light receiving surface of the photoelectric conversion element for shielding light incident on the photoelectric conversion element from a specific direction. The element isolation region is formed to project in the depth direction of the semiconductor layer from the light shielding region toward a portion between the multiple photoelectric conversion elements in order to electrically and optically isolate the multiple photoelectric conversion elements from one another.

A solid state imaging device and a method of manufacturing the solid state imaging device according to an embodiment will be described below in detail with reference to the accompanying drawings. The present invention is not limited to the embodiment.

Figure 1:
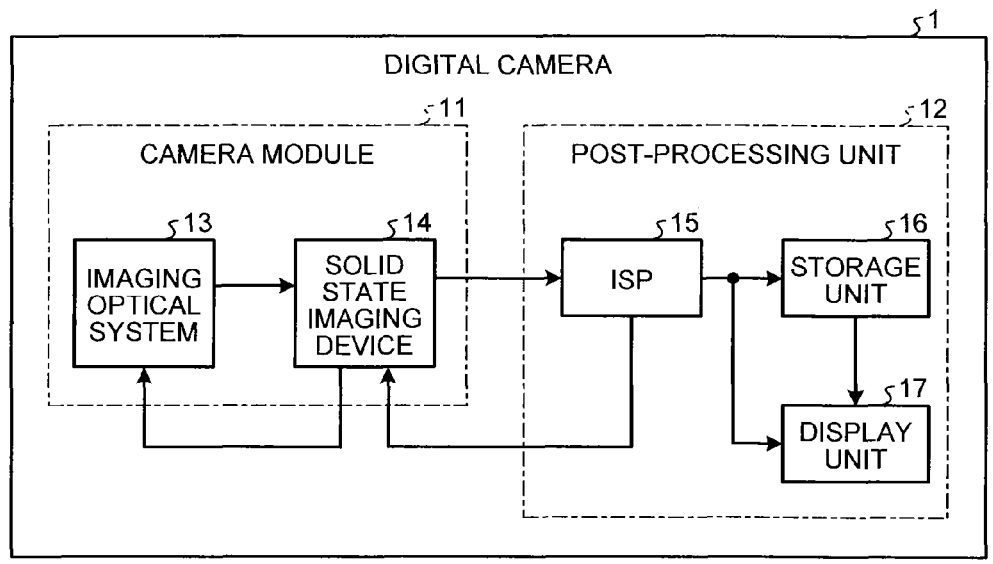
FIG. 1 is a block diagram illustrating a schematic configuration of a digital camera having a solid state imaging device according to an embodiment.

FIG. 1 is a block diagram illustrating a schematic configuration of a digital camera 1 including a solid state imaging device 14 according to the embodiment. As illustrated in FIG. 1, the digital camera 1 includes a camera module 11 and a post-processing unit 12.

The camera module 11 includes an imaging optical system 13 and the solid state imaging device 14. The imaging optical system 13 takes light from a subject to image a subject image. The solid state imaging device 14 captures the subject image, imaged by the imaging optical system 13, and outputs an image signal obtained by the image-capture to the post-processing unit 12.

The solid state imaging device 14 generates a control signal that automatically adjusts a focus of the imaging optical system 13, and outputs the generated signal to the imaging optical system 13. The camera module 11 mounted to the digital camera 1 is also applied to an electronic device such as a mobile terminal with camera.

The post-processing unit 12 includes an ISP (Image Signal Processor) 15, a storage unit 16, and a display unit 17. The ISP 15 performs a signal process to the image signal inputted from the solid state imaging device 14. The ISP 15 executes a high-quality process including a noise eliminating process, a defective pixel correcting process, and a resolution converting process.

Figure 2:
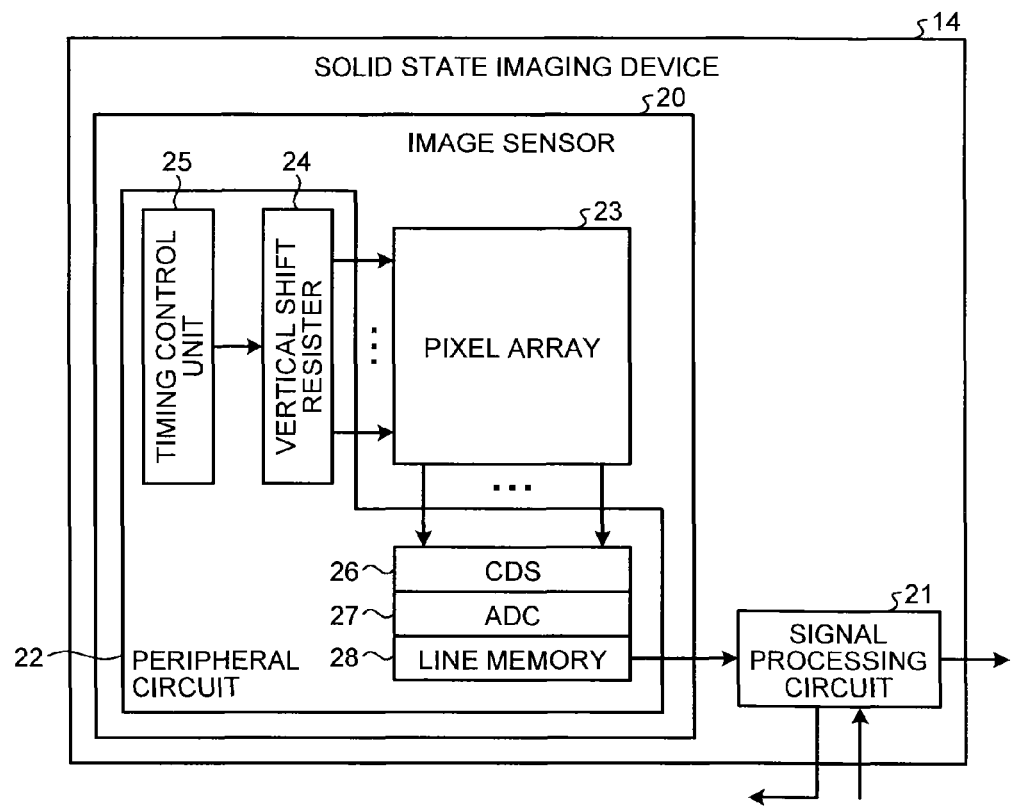
FIG. 2 is a block diagram illustrating a schematic configuration of the solid state imaging device according to the embodiment.

The ISP 15 outputs the image signal, which has undergone the signal process, to the storage unit 16, the display unit 17, and a later-described signal processing circuit (FIG. 2)

mounted in the solid state imaging device 14 in the camera module 11. The image signal fed back to the camera module 11 from the ISP 15 is used to adjust and control the solid state imaging device 14.

The storage unit 16 stores the image signal inputted from the ISP 15 as an image. The storage unit 16 also outputs the image signal of the stored image to the display unit 17 according to a user's operation. The display unit 17 displays an image according to the image signal inputted from the ISP 15 or the storage unit 16. The display unit 17 is a liquid crystal display, for example.

Next, the solid state imaging device 14 mounted to the camera module 11 will be described with reference to FIG. 2. FIG. 2 is a block diagram illustrating a schematic configuration of the solid state imaging device 14 according to a first embodiment. As illustrated in FIG. 2, the solid state imaging device 14 includes an image sensor 20, and the signal processing circuit 21.

This embodiment describes the case in which the image sensor 20 is a back surface irradiation type CMOS (Complementary Metal Oxide Semiconductor) image sensor having a wiring layer formed on the side reverse to the side where the incident light from the photoelectric conversion element, which photoelectrically converts the incident light, enters.

The image sensor 20 according to the present embodiment is not limited to the back surface irradiation type CMOS image sensor. The image sensor 20 may be any image sensors including a front surface irradiation type CMOS image sensor, and a CCD (Charge Coupled Device) image sensor.

The image sensor 20 includes a peripheral circuit 22 and a pixel array 23. The peripheral circuit 22 includes a vertical shift resister 24, a timing control unit 25, a CDS (correlated double sampling unit) 26, an ADC (analog-digital conversion unit) 27, and a line memory 28.

The pixel array 23 is provided on an imaging region of the image sensor 20. The pixel array 23 has the multiple photoelectric conversion elements mounted on the semiconductor layer and corresponding to each pixel of the captured image. The multiple photoelectric conversion elements are arranged in the horizontal direction (in the row direction) and in the vertical direction (in the column direction) in a two-dimensional array (matrix array). Each photoelectric conversion element on the pixel array 23 generates signal charges (e.g., electrons) according to the amount of the incident light, and stores the generated charges.

The timing control unit 25 is a processing unit outputting a pulse signal, serving as a reference of an operation timing, to the vertical shift resister 24. The vertical shift register 24 is a processing unit outputting to the pixel array 23 a selection signal for selecting, one by one on the column basis, the photoelectric conversion element from which the signal charges are read, out of the multiple photoelectric conversion elements arranged in an array (matrix).

The pixel array 23 outputs the signal charges, which are stored in each of the selected photoelectric conversion elements on the column basis by the selection signal inputted from the vertical shift register 24, to the CDS 26 from the photoelectric conversion element as a pixel signal indicating brightness of each pixel.

The CDS 26 is a processing unit that eliminates noise from the pixel signal inputted from the pixel array 23 by correlated double sampling, and outputs the resultant to the ADC 27. The ADC 27 converts the analog pixel signal inputted from the CDS 26 into a digital pixel signal, and outputs the converted signal to the line memory 28. The line memory 28 temporarily stores the pixel signal inputted from the ADC 27, and outputs the held pixel signal to the signal processing circuit 21 for each row of the photoelectric conversion elements.

The signal processing circuit 21 performs a predetermined signal process to the pixel signal inputted from the line memory 28, and outputs the resultant signal to the post-processing unit 12. The signal processing circuit 21 performs a signal process, such as a lens shading correction, defect correction, and noise eliminating process, to the pixel signal.

As described above, in the image sensor 20, the multiple photoelectric conversion elements arranged on the pixel array 23 photoelectrically convert the incident light into the signal charges in an amount corresponding to the amount of the received light, and store the charges, and then, the peripheral circuit 22 reads the signal charges stored in each photoelectric conversion element as the pixel signal. Thus, the image sensor 20 can capture an image.

The pixel array 23 includes a focus-detecting photoelectric conversion element (referred to as "phase difference detecting element" below) provided to detect the focus of the imaging optical system 13 according to a pupil division phase difference detection system. At least two phase difference detecting elements, i.e., a pair of phase difference detecting elements, are provided in the pixel array 23 on a proximate position.

A light shielding portion (referred to as a "phase difference pattern" below) for covering a part of (e.g., a half of) a light receiving region is formed on the light receiving surface of each phase difference detecting element. A light shielding portion is also provided on the light receiving surface of the imaging photoelectric conversion element so as to enclose each photoelectric conversion element as viewed from the light receiving surface.

In the solid state imaging device 14, the signal processing unit 21 calculates the phase difference of the light received by each phase difference detecting element based upon the signal charges photoelectrically converted by the pair of phase difference detecting elements. The signal processing circuit 21 moves a lens in the imaging optical system 13 to make the calculated phase difference close to the phase difference that is a focusing reference, thereby executing automatic focusing process.

Figure 3:
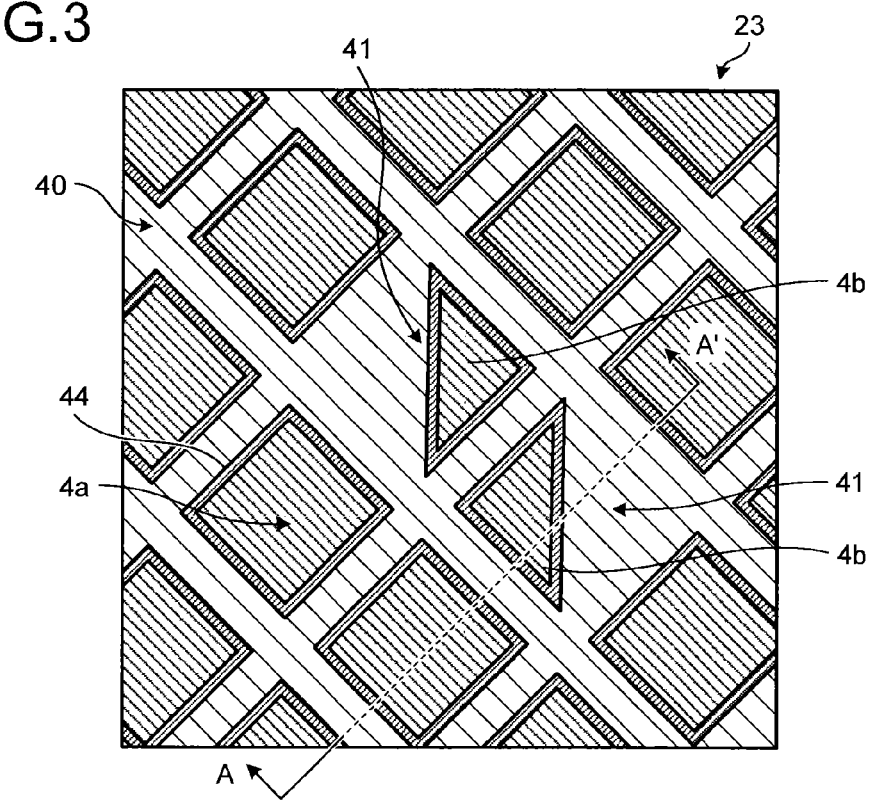
FIG. 3 is an explanatory view illustrating a shape of a light shielding portion and a phase difference pattern according to the embodiment.

Next, the shape of the light shielding portion and the phase difference pattern on the pixel array 23 will be described with reference to FIG. 3. FIG. 3 is an explanatory view for describing a shape of a light shielding portion 40 and a shape of a phase difference pattern 41 according to the embodiment. FIG. 3 does not illustrate the components formed on the side closer to the light incident side than to the semiconductor layer on which the imaging photoelectric conversion elements 4a and the phase difference detecting elements 4b are formed.

As illustrated in FIG. 3, multiple photoelectric conversion elements 4a whose light receiving surfaces are exposed in a rectangular shape viewed from the light incident side are provided on the pixel array 23 in a matrix. On the pixel array 23, a pair of phase difference detecting elements 4b whose light receiving surfaces are exposed in a triangular shape viewed from the light incident side is provided to be adjacent to each other. The half of the rectangular light receiving surface of the phase difference detecting element 4b across the diagonal line of the light receiving surface is covered by the phase difference pattern 41. Thus, the light receiving surface is exposed in the triangular shape.

The phase difference pattern 41 covers the halves of the light receiving surfaces, symmetric with each other, of the pair of phase difference detecting elements 4b as described above. With this configuration, the pair of phase difference detecting elements 4b receives light incident from the oblique direction that inclines at a symmetric angle with respect to the direction perpendicular to the light receiving surface, and pupil-divides the incident light. The signal processing circuit 21 calculates the phase difference of a pair of pupil-divided light, and compares the calculated phase difference and the reference phase difference. Thus, the signal processing circuit 21 can execute automatic focusing.

The light shielding portion 40 is formed in a matrix, viewed from the light incident side, around the photoelectric conversion elements 4a and the phase difference detecting elements 4b. The light shielding portion 40 can shield light introducing to each of the photoelectric conversion elements 4a and the phase difference detecting elements 4b from the adjacent photoelectric conversion element 4a or the phase difference detecting element 4b. An insulating film 44 is formed between the photoelectric conversion element 4a as well as the phase difference detecting element 4b, and the light shielding portion 40 as well as the phase difference pattern 41.

In the present embodiment, the pixel array 23 is formed in order that the light-receiving sensitivity can be enhanced without reducing the thickness of the light shielding portion 40 and the phase difference pattern 41, those of which shield light. The configuration of the pixel array 23 according to the embodiment will be described below with reference to FIG. 4.

Figure 4:
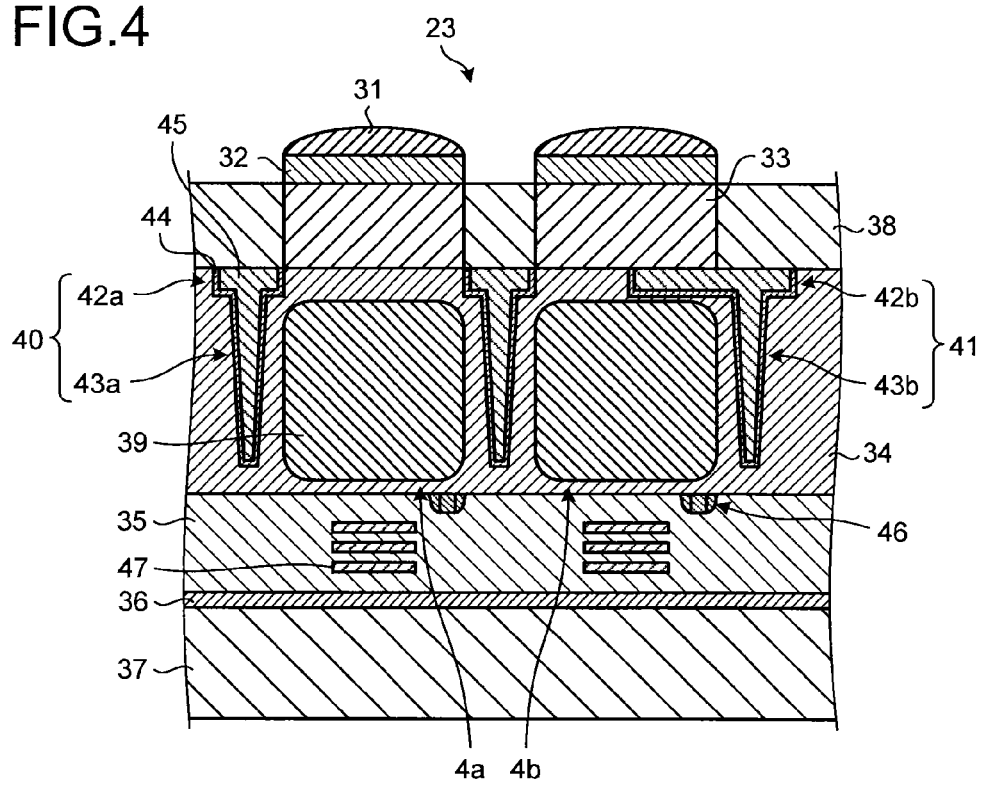
FIG. 4 is an explanatory view schematically illustrating a cross-section taken along a line A-A' in FIG. 3.

FIG. 4 is an explanatory view schematically illustrating the cross-section along a line A-A' in FIG. 3. FIG. 4 illustrates the components formed on the light incident side from the semiconductor layer on which the imaging photoelectric conversion elements 4a and the phase difference detecting elements 4b are formed. A first conductive type will be described as P-type, and a second conductive type will be described as N-type below. However, the first conductive type may be N-type, and the second conductive type may be P-type.

As illustrated in FIG. 4, the pixel array 23 includes, in the order from the light incident side, a microlens 31, a color filter 32, a waveguide 33, a P-type semiconductor (here, Si: silicon) 34, an insulating layer 35, an adhesive layer 36, and a support substrate 37.

The microlens 31 is a plano-convex lens that collects incident light. The color filter 32 is a filter selectively transmitting any one of color lights of red, green, blue, and white. The waveguide 33 guides the light passing through the color filter 32 to the P-type Si layer 34, and it is made of silicon nitride, for example. A protection film 38 made of silicon oxide is formed around the waveguide 33, for example.

The P-type Si layer 34 is, for example, a region formed by epitaxially growing Si having P-type impurities such as boron doped therein. The P-type Si layer 34 may be formed by an ion implantation of P-type impurities into Si wafer.

An N-type Si region 39 is formed in the P-type Si layer 34 where the photoelectric conversion elements 4a and the phase difference detecting elements 4b are formed. In the pixel array 23, a photodiode formed by PN junction of the P-type Si layer 34 and the N-type Si region 39 becomes the photoelectric conversion elements 4a and the phase difference detecting elements 4b.

A reading gate 46 for reading signal charges from the photoelectric conversion elements 4a and the phase difference detecting elements 4b and a multi-layer wiring 46 are formed in the insulating layer 35. The adhesive layer 36 and the support substrate 37 will be described later.

In the pixel array 23 according to the embodiment, the light shielding portion 40 and the phase difference pattern 41 are formed in the P-type Si layer 34 close to the light receiving surface, not on the upper layers (light incident side) on the P-type Si layer 34 where the photoelectric conversion elements 4a and the phase difference detecting elements 4b are formed.

Specifically, the light shielding portion 40 includes, in the P-type Si layer 34 on the side close to the light receiving surface of the photoelectric conversion element 4a, a light shielding region 42a formed between the photoelectric conversion elements 4a and an element isolation region 43a formed to project in the depth direction of the P-type Si layer 34 from the light shielding region 42a to the portion between the N-type Si regions 39.

The light shielding portion 40 is formed such that a trench is formed in the P-type Si layer 34 on the position where the light shielding region 42a and the element isolation region 43a are formed, the inner peripheral surface of the trench is covered by the insulating film 44, and then, the trench is buried with the light shielding member 45.

The light shielding region 42a of the light shielding portion 40 shields light incident from a specific direction upon each of the photoelectric conversion elements 4a, e.g., light incident from the color filter 32 on the adjacent photoelectric conversion element 4a. The element isolation region 43a electrically and optically isolates the respective photoelectric conversion elements 4a from one another or isolates the photoelectric conversion element 4a from the phase difference detecting element 4b.

The phase difference pattern 41 includes a light shielding region 42b formed on the position covering a part (here, a half) of the light receiving surface of the phase difference detecting element 4b, and an element isolation region 43b formed to project in the depth direction of the P-type Si layer 34 from the light shielding region 42b to the portion between the N-type Si regions 39.

The phase difference pattern 41 is formed such that a trench is formed in the P-type Si layer 34 on the position where the light shielding region 42b and the element isolation region 43b are formed, the inner peripheral surface of the trench is covered by the insulating film 44, and then, the trench is buried with the light shielding member 45.

The light shielding region 42b of the phase difference pattern 41 shields light incident from a specific direction upon each of the phase difference detecting elements 4b, e.g., light incident from the oblique direction inclined at a predetermined angle with respect to the direction perpendicular to the light receiving surface. The element isolation region 43b electrically and optically isolates the phase difference detecting elements 4b from each other or isolates the phase difference detecting element 4b from the photoelectric conversion element 4a.

As described above, the pixel array 23 has the light shielding regions 42a and 42b in the P-type Si layer 34, in which the photoelectric conversion elements 4a and the phase difference detecting elements 4b are formed, on the side close to the light receiving surface. Therefore, even if the incident light irregularly reflects on the side face of the light shielding regions 42a and 42b on the pixel array 23, the irregular reflection occurs on the position closer to the photoelectric conversion elements 4a and the phase difference detecting elements 4b than in the case where the light shielding portion is formed on the upper layers on the P-type Si layer 34.

Accordingly, the pixel array 23 can efficiently receive light, which is irregularly reflected on the side face of the light shielding regions 42a and 42b, by the photoelectric conversion elements 4a and the phase difference detecting elements 4b, thereby being capable of enhancing light-receiving sensitivity.

Since the pixel array 23 can efficiently receive light that is irregularly reflected on the side face of the light shielding regions 42a and 42b, the light shielding regions 42a and 42b do not have to be thinned. Therefore, the pixel array 23 can prevent the elimination of the pattern on the light shielding regions 42a and 42b caused by reducing the thickness of the light shielding regions 42a and 42b.

In the pixel array 23, the light shielding portion 40 and the phase difference pattern 41 are formed in the P-type Si layer 34. Therefore, the flatness of the top surface, which serves as the light receiving surface, of the P-type Si layer 34 can be secured. Thus, the pixel array 23 can prevent the generation of void in the waveguide 33 and the protection film 38 upon forming the waveguide 33 and the protection film 38 on the upper layers on the P-type Si layer 34, thereby being capable of preventing the deterioration in the light-receiving sensitivity caused by the void.

A method of manufacturing the solid state imaging device 14 according to the embodiment will be described with reference to FIGS. 5A to 7C. The method of manufacturing the components of the solid state imaging device 14 other than the pixel array 23 is the same as a general CMOS image sensor. Therefore, the method of manufacturing the pixel array 23 in the solid state imaging device 14 will only be described below.

FIGS. 5A to 7C are cross-sectional views schematically illustrating a manufacturing process of the solid state imaging device 14 according to the embodiment. FIGS. 5A to 7C selectively illustrate the manufacturing process of the portion illustrated in FIG. 4 in the pixel array 23.

Figure 5A:
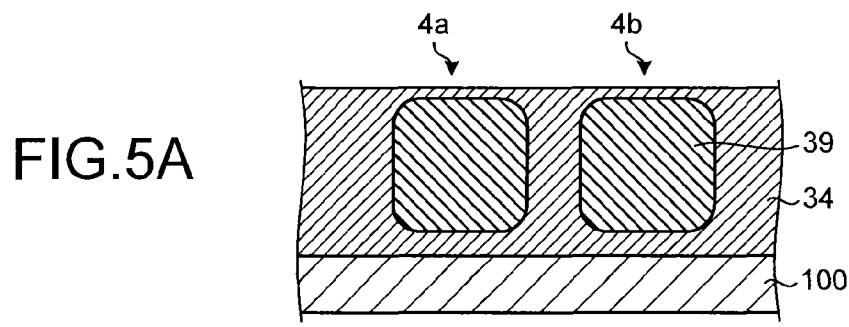
FIGS. 5A to 7C are cross-sectional views schematically illustrating a manufacturing process of the solid state imaging device according to the embodiment.

As illustrated in FIG. 5A, upon manufacturing the pixel array 23, the P-type Si layer 34 is formed on a semiconductor substrate 100 such as a Si wafer. The P-type Si layer 34 is formed by epitaxially growing the Si layer, into which P-type impurities such as boron are doped, on the semiconductor substrate 100. The P-type Si layer 34 may be formed by the ion implantation of the P-type impurities into the Si wafer, and performing an annealing process.

Then, N-type impurities such as phosphor are injected by the ion implantation into the position on the P-type Si layer 34 where the photoelectric conversion element 4a and the phase difference detecting element 4b are to be formed, and then, the annealing process is performed. Thus, the N-type Si region 39 is formed. According to the process described above, the photoelectric conversion element 4a and the phase difference detecting element 4b, serving as photodiodes, are formed on the pixel array 23 by the PN junction between the P-type Si layer 34 and the N-type Si region 39.

Figure 5B:
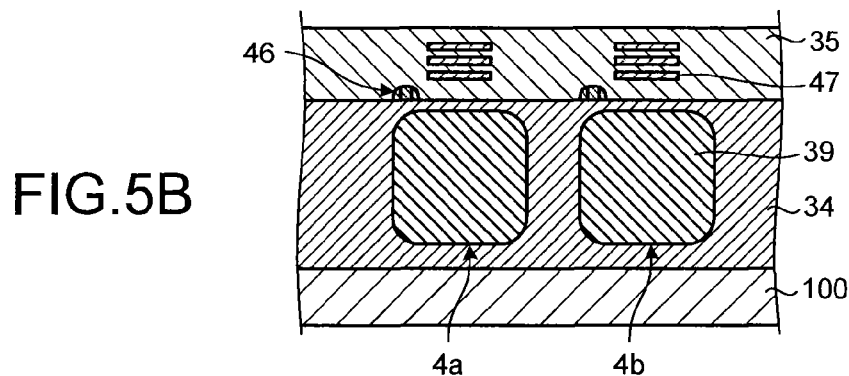

Thereafter, as illustrated in FIG. 5B, the insulating layer 35 is formed together with the reading gate 46 and the multi-layer wiring 47 on the P-type Si layer 34. During this process, after the reading gate 46 is formed on the top surface of the P-type Si layer 34, a process of forming a silicon oxide layer, a process of forming a predetermined wiring pattern on the silicon oxide layer, and a process of forming the multi-layer wiring 47 by burying Cu into the wiring pattern are repeated. Thus, the insulating layer 35 having the reading gate 46 and the multi-layer wiring 47 formed therein is formed.

Figure 5C:
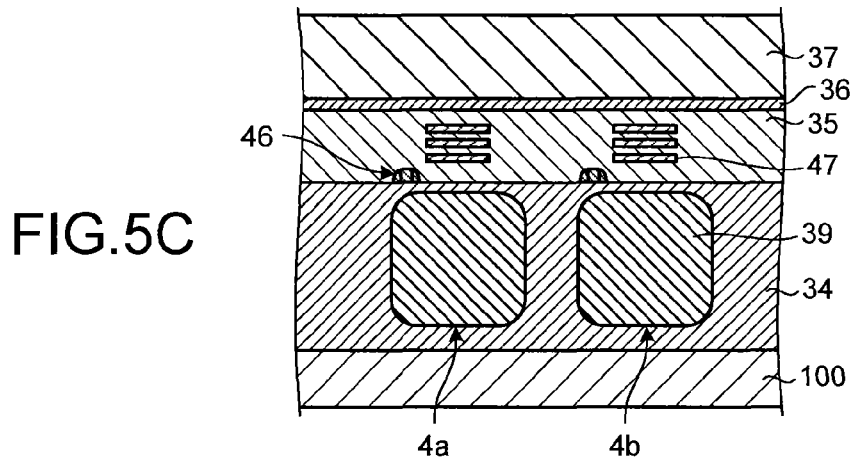
Figure 5D:
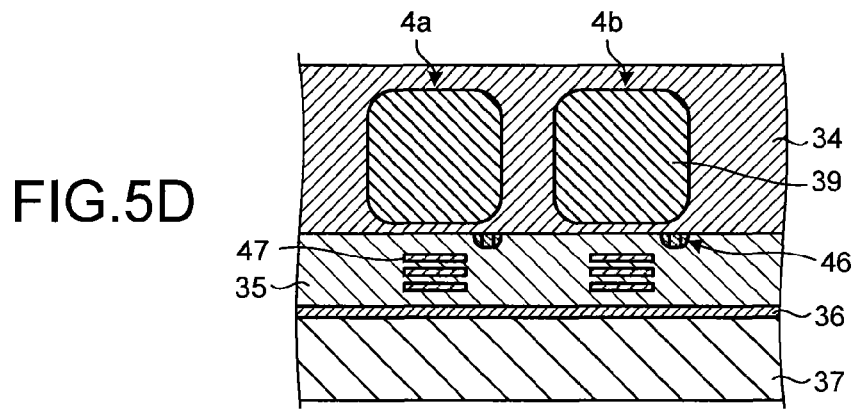

Next, as illustrated in FIG. 5C, an adhesive agent is applied on the top surface of the insulating layer 35 to form the adhesive layer 36, and the support substrate 37 such as a Si wafer is adhered onto the top surface of the adhesive layer 36. Thereafter, the structure is turned upside down as illustrated in FIG. 5D. Then, the semiconductor substrate 100 is polished from the back side (here, from the top surface) by a polishing device such as a grinder until the semiconductor substrate 100 has a predetermined thickness.

The back side of the semiconductor substrate 100 is further polished by, for example, a CMP (Chemical Mechanical Polishing) in order to expose the back surface (here, the top surface) serving as the light receiving surface of the P-type Si layer 34 as illustrated in FIG. 5D.

Figure 6A:
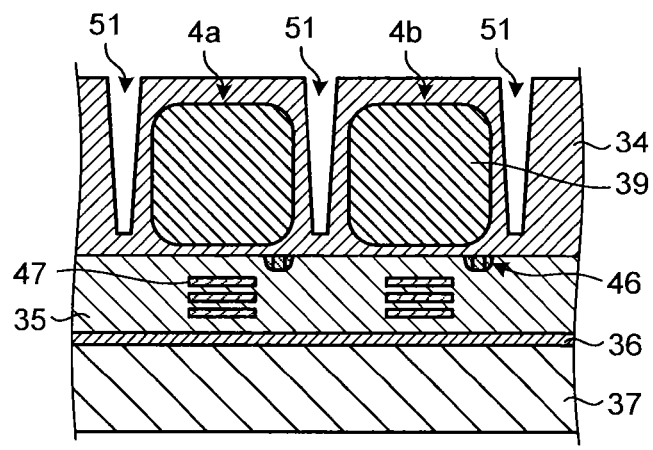

Then, a first trench 51 is formed by, for example, RIE (Reactive Ion Etching) on the position where the element isolation regions 43a and 43b (see FIG. 4) are to be formed in the P-type Si layer 34, i.e., on the position between the N-type Si regions 39, as illustrated in FIG. 6A.

Figure 6B:
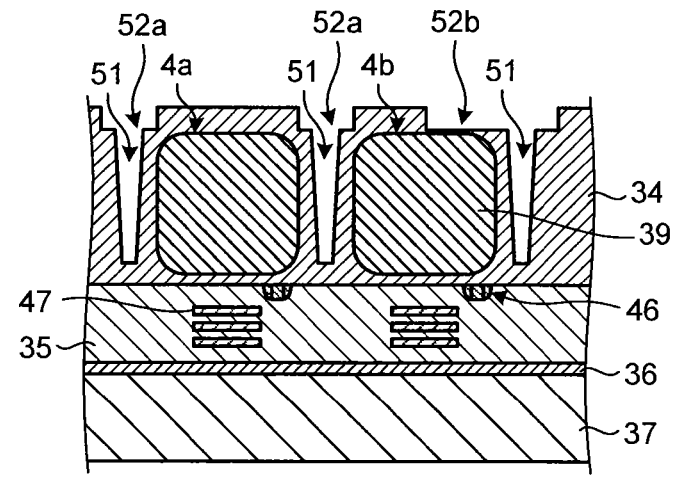

As illustrated in FIG. 6B, the width of the first trench 51 on its top end is increased to form a second trench 52b on the position where the light shielding region 42a (see FIG. 4) is to be formed and to form a second trench 52b on the position where the light shielding region 42b (see FIG. 4) is to be formed.

It is preferable that the second trench 52a has a width not overlapping with the outer periphery of the N-type Si region 39 viewed from top, and is flush with the top surface of the N-type Si region 39 or has almost the same depth of the N-type Si region 39 in the P-type Si layer 34 viewed from the cross-section. In other words, the second trench 52a is formed on the position enclosing the outer periphery of the light receiving surface of the imaging photoelectric conversion element 4a.

The second trench 52b is formed to have a width overlapping with a part (here, a half) of the top surface of the N-type Si region 39 in the phase difference detecting element 4b viewed from top, and to be flush with the top surface of the N-type Si region 39 or to have almost the same depth as the N-type Si region 39 in the P-type Si layer 34 as viewed from cross-section.

Figure 6C:
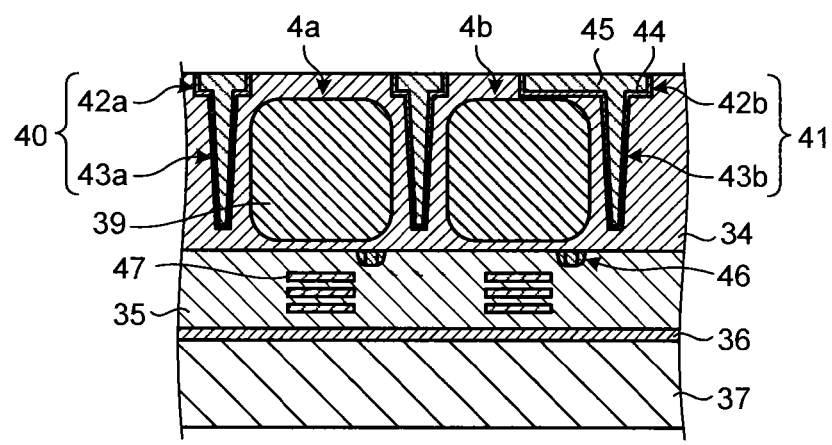

Thereafter, as illustrated in FIG. 6C, the insulating film 44 made of silicon oxide, for example, is formed on the inner peripheral surfaces of the first trench 51 and the second trenches 52a and 52b according to the CVD (Chemical Vapor Deposition) or sputtering. The light shielding member 45 such as aluminum is buried in the first trench 51 and the second trenches 52a and 52b, covered by the insulating film 44 on their inner peripheral surfaces, according to the CVD.

With this process, the light shielding portion 40 including the light shielding region 42a and the element isolation region 43a, and the phase difference pattern 41 including the light shielding region 42b and the element isolation region 43b can simultaneously be formed. The insulating film 44 may be the other insulating film such as a silicon nitride film. The light shielding member 45 may be other metals having light shielding property, such as tungsten or copper. The light shielding member 45 may be an insulating material, such as silicon oxide or silicon nitride, having refractive index different from that of Si.

As described above, the light shielding portion 40 and the phase difference pattern 41 are formed in the P-type Si layer 34 on which the photoelectric conversion element 4a and the phase difference detecting element 4b are formed in the present embodiment. Therefore, the flatness of the light receiving surface (top surface) of the P-type Si layer 34 can be secured.

In the present embodiment, the top surfaces of the light shielding regions 42a and 42b match the top surface of the P-type Si layer 34, and the lower surfaces thereof are flush with the top surface of the N-type Si region 39 or they have almost the same depth as the N-type Si region 39. This configuration can make the side faces of the light shielding regions 42a and 42b close to the PN junction between the top surface of the N-type Si region 39 and the P-type Si layer 34 as much as possible.

Accordingly, even if the incident light irregularly reflects on the side faces of the light shielding regions 42a and 42b, the pixel array 23 can allow the photoelectric conversion element 4a and the phase difference detecting element 4b to receive almost all the irregularly reflected light, thereby being capable of enhancing the light-receiving sensitivity.

Figure 7A:
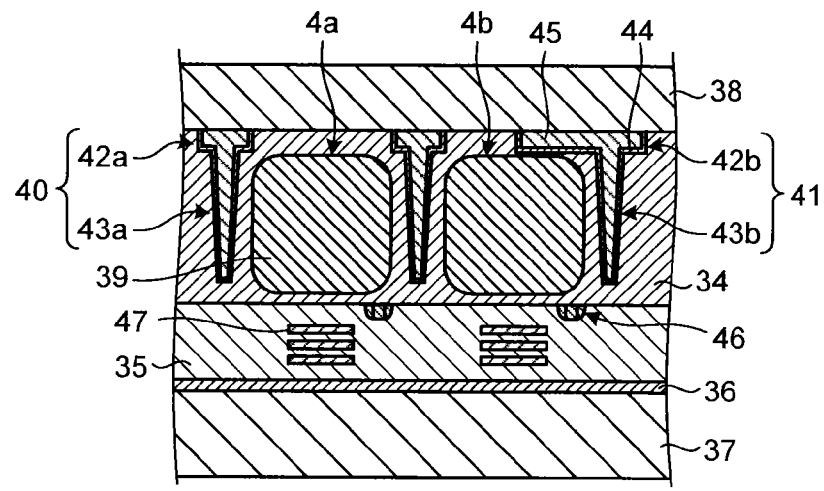
Figure 7B:
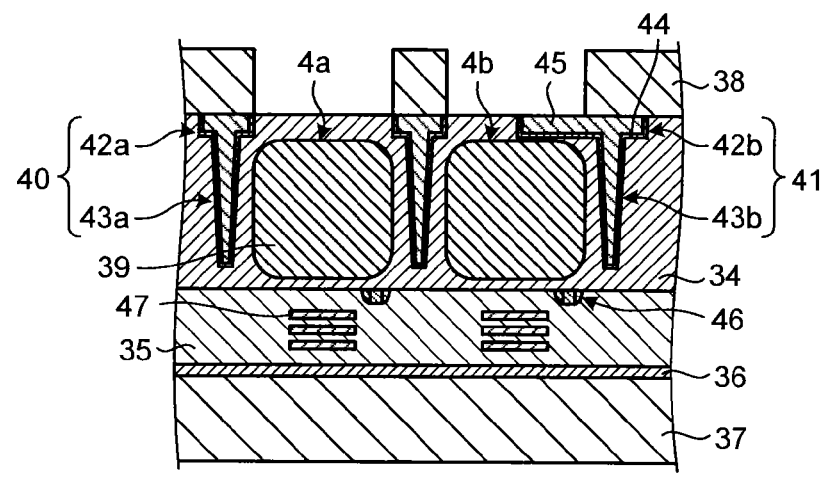

Next, as illustrated in FIG. 7A, the protection film 38 is formed on the top surface of the P-type Si layer 34 by stacking the silicon oxide with the CVD. As illustrated in FIG. 7B, the protection film 38 on the photoelectric conversion element 4a and the phase difference detecting element 4b is selectively removed.

Figure 7C:
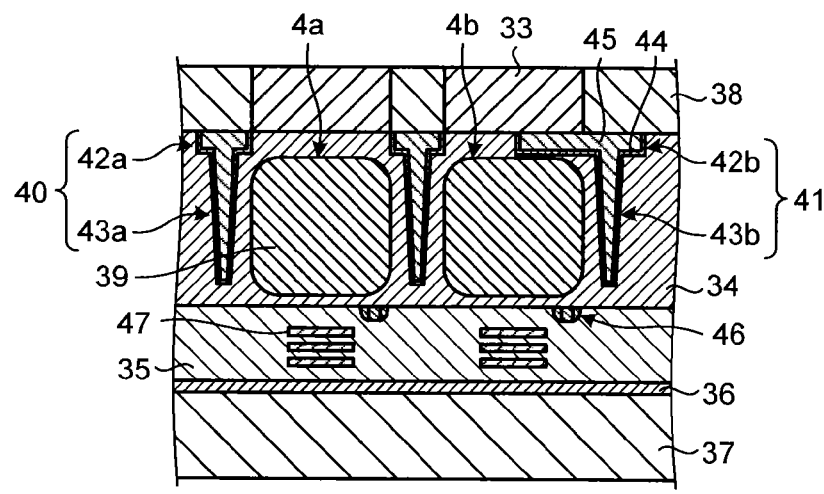

As illustrated in FIG. 7C, silicon nitride is stacked in the opening formed by selectively removing the protection film 38 with the CVD, in order to form the waveguide 33. The top surface of the P-type Si layer 34 on which the silicon nitride is stacked holds flatness as described above. Therefore, the generation of the void in the waveguide 33 during the process of forming the waveguide 33 is prevented, whereby the deterioration in the light-receiving sensitivity of the pixel array 23 caused by the void can be prevented.

Thereafter, the color filter 32 and the microlens 31 are sequentially formed on the top surface of the waveguide 33. Thus, the pixel array 23 illustrated in FIG. 4 is formed. In the above description, the image sensor 20 according to the embodiment is the back surface irradiation type image sensor. However, the light shielding portion 40 and the phase difference pattern 41 according to the embodiment are applicable to a front surface irradiation type image sensor.

Figure 8:
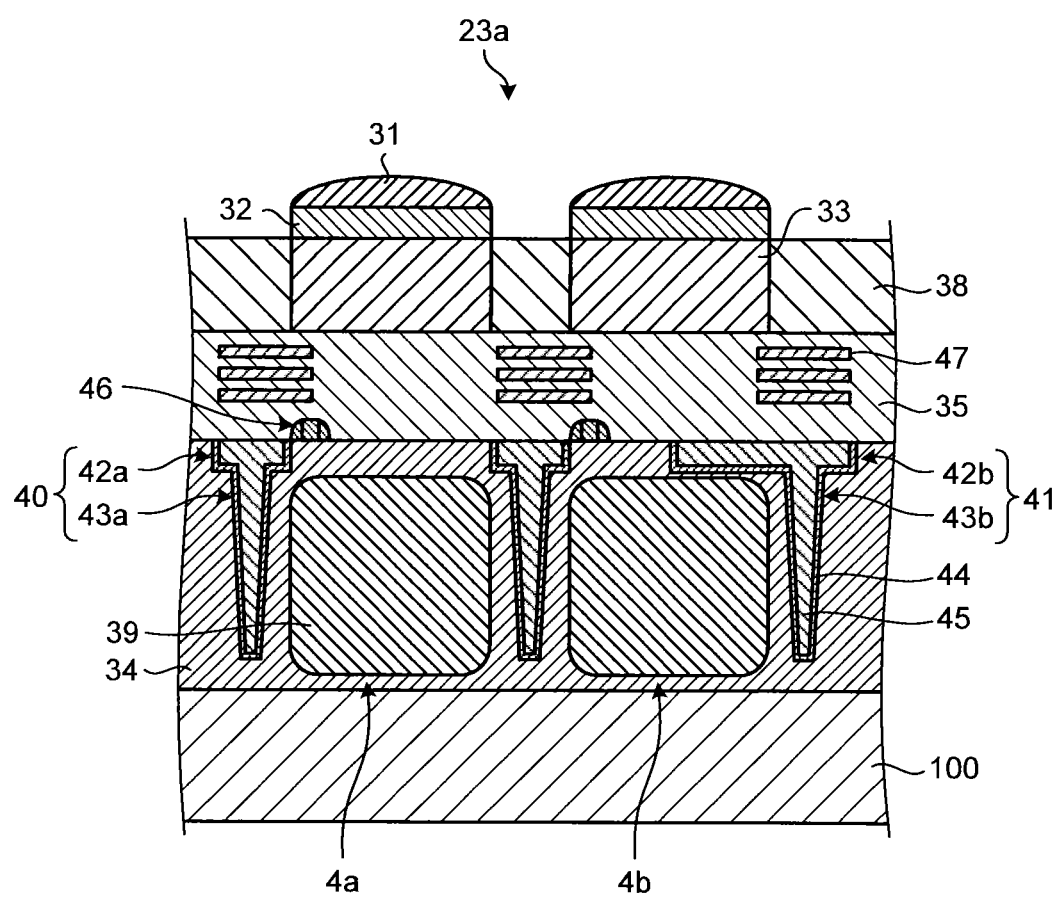
FIG. 8 is an explanatory view when the light shielding portion and the phase difference pattern according to the embodiment are employed for a front surface irradiation type image sensor.

FIG. 8 is an explanatory view when the light shielding portion 40 and the phase difference pattern 41 according to the embodiment are employed for the front surface irradiation type image sensor. FIG. 8 illustrates a part of a schematic cross-section of a pixel array 23a in the front surface irradiation type image sensor. The components in FIG. 8 having the same function as the components in FIG. 4 are identified by the same numerals, and the redundant description will not be repeated.

As illustrated in FIG. 8, the pixel array 23a has the configuration same as the pixel array 23 illustrated in FIG. 4 except that the P-type Si layer 34 is formed on the semiconductor substrate 100, and the insulating layer 35 in which the reading gate 46 and the multi-layer wiring 47 are formed is arranged on the light receiving surface (top surface) of the P-type Si layer 34.

Even when the light shielding portion 40 and the phase difference pattern 41 according to the embodiment are applied to the front surface irradiation type image sensor, the internal structure of the P-type Si layer 34 is the same as the pixel array 23 in FIG. 4. Therefore, like the pixel array 23 in FIG. 4, the pixel array 23a in FIG. 8 can enhance the light-receiving sensitivity without reducing the thickness of the light shielding region 42a of the light shielding portion 40 and the light shielding region 42b of the phase difference pattern 41.

As described above, the solid state imaging device according to the embodiment has the light shielding portion for shielding light incident upon the photoelectric conversion element from a specific direction, the light shielding portion being provided in the semiconductor layer on which the photoelectric conversion element is formed. This configuration can make the side faces of the light shielding portion close to the photoelectric conversion element as much as possible. Accordingly, even if the incident light irregularly reflects on the side face of the light shielding portion, the photoelectric conversion element can receive almost all the irregularly reflected light, whereby the light-receiving sensitivity can be enhanced.

In the solid state imaging device according to the embodiment, the flatness of the light receiving surface of the semiconductor layer can be secured even without reducing the thickness of the light shielding portion. Therefore, the elimination of the pattern on the light shielding portion caused by the reduction in the thickness of the light shielding portion can be prevented.

In the solid state imaging device according to the embodiment, the flatness of the light receiving surface of the semiconductor layer can be secured. Therefore, the generation of the void in the components formed on the upper layers on the semiconductor layer is prevented, whereby the deterioration in the light-receiving sensitivity of the pixel array 23 caused by the void can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state imaging device comprising:
   a semiconductor layer having multiple photoelectric conversion elements arranged in a two-dimensional array;
   a light shielding portion that is provided in the semiconductor layer, and includes a light shielding member having an interface with the semiconductor layer, the interface being covered by an insulating film, wherein
   the light shielding portion includes:
   a light shielding region that is provided in the semiconductor layer on the side close to a light receiving surface of a photoelectric conversion element of the multiple photoelectric conversion elements for shielding light incident on the photoelectric conversion element from a specific direction; and
   an element isolation region that is provided to project in a depth direction of the semiconductor layer from the light shielding region toward a portion between the multiple photoelectric conversion elements in order to electrically and optically isolate the multiple photoelectric conversion elements from one another, wherein
   the light shielding region is provided on a position covering a part of the light receiving surface of the photoelectric conversion element that outputs a signal charge for detecting a focus by a pupil division phase difference detection system, out of the multiple photoelectric conversion elements.

2. The solid state imaging device according to claim 1, wherein
   the light shielding portion further includes a light shielding region that is provided on a position enclosing the outer periphery of the light receiving surface of the photoelectric conversion element that outputs a signal charge for an image capture, out of the photoelectric conversion elements, in order to shield light incident upon the photoelectric conversion element from a specific direction.

3. The solid state imaging device according to claim 1, wherein
the photoelectric conversion elements are a photodiode formed of a PN junction between the semiconductor layer of a first conductive type and a semiconductor region of a second conductive type formed in the semiconductor layer,
the light shielding region is formed such that a light receiving surface of the light shielding region coincides with a light receiving surface of the semiconductor layer, and a first depth of a surface opposite to the light receiving surface of the light shielding region is almost the same as a second depth of a light receiving surface of the semiconductor region of the second conductive type formed in the semiconductor layer of the first conductive type, and
the first depth is a depth from the light receiving surface of the light shielding region, and the second depth is a depth from the light receiving surface of the semiconductor layer.

4. The solid state imaging device according to claim 1, wherein
the insulating film is a silicon oxide film, and
the light shielding member is a metal having light shielding property.

5. The solid state imaging device according to claim 1, further comprising:
a waveguide that is provided on a top surface of the semiconductor layer for guiding incident light to the photoelectric conversion element.

6. The solid state imaging device according to claim 5, wherein the waveguide is made of silicon nitride formed on a position facing the light receiving surface of the photoelectric conversion element, and is enclosed by silicon oxide.

* * * * *